United States Patent
Rajendran et al.

(10) Patent No.: US 8,325,752 B2
(45) Date of Patent: Dec. 4, 2012

(54) TECHNIQUE FOR SHARING TRANSMIT AND RECEIVE PORTS OF A CMOS BASED TRANSCEIVER

(75) Inventors: Gireesh Rajendran, Karnataka (IN); Apu Sivadas, Karnataka (IN); Rittu Kulwant Sachdev, Karnataka (IN); Krishnaswamy Thiagarajan, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 1162 days.

(21) Appl. No.: 12/181,327

(22) Filed: Jul. 29, 2008

(65) Prior Publication Data

US 2010/0027568 A1 Feb. 4, 2010

(51) Int. Cl.
*H04L 12/28* (2006.01)

(52) U.S. Cl. ............... 370/419; 330/310; 330/51

(58) Field of Classification Search .......... 330/51, 330/253, 310–311; 331/59; 455/296, 307, 455/323, 326, 339, 340; 327/534; 370/254, 370/259, 310, 321, 419
See application file for complete search history.

(56) References Cited

U.S. PATENT DOCUMENTS

| | | | |
|---|---|---|---|
| 7,071,776 B2 * | 7/2006 | Forrester et al. | 330/129 |
| 7,369,096 B2 * | 5/2008 | Castaneda et al. | 343/859 |
| 7,720,443 B2 * | 5/2010 | Toncich et al. | 455/73 |
| 8,102,205 B2 * | 1/2012 | Pletcher et al. | 330/51 |
| 2006/0063484 A1 * | 3/2006 | Proctor et al. | 455/7 |
| 2007/0072576 A1 * | 3/2007 | Sjoland et al. | 455/323 |
| 2008/0293368 A1 * | 11/2008 | Desai et al. | 455/138 |
| 2009/0289721 A1 * | 11/2009 | Rajendran et al. | 330/301 |
| 2010/0027568 A1 * | 2/2010 | Rajendran et al. | 370/532 |
| 2010/0309827 A1 * | 12/2010 | Choi | 370/280 |
| 2011/0316637 A1 * | 12/2011 | Pletcher et al. | 330/310 |

OTHER PUBLICATIONS

A Single-Chip Bluetooth EDR Device in 0.13um CMOS, Marholev, B.; Pan, M.; Chien, E.; Zhang, L.; Roufoogaran, R.; Wu, S.; Bhatti, I.; Lin, T.-H.; Kappes, M.; Khorram, S.; Anand, S.; Zolfaghari, A.; Castaneda, J.; Chien, C.M.; Ibrahim, B.; Jensen, H.; Kim, H.; Lettieri, P.; Mak, S.; Lin, J.; Wong, Y.C.; Lee, R.; Syed, M.; Rofougaran, M.; Rofougaran, A.; Solid-State Circuits Conference, 2007. ISSCC 2007. Digest of Technical Papers. IEEE International.

0.18/spl mu/m thin oxide CMOS transceiver front-end with integrated T/sub x//R/sub x/ commutator for low cost Bluetooth solutions, Knopik, V.; Belot, D.;Solid-State Circuits Conference, 2003. ESSCIRC '03. Proceedings of the 29th European.

(Continued)

*Primary Examiner* — Ayaz Sheikh
*Assistant Examiner* — Mounir Moutaouakil
(74) *Attorney, Agent, or Firm* — Wade J. Brady, III; Frederick J. Telecky, Jr.

(57) ABSTRACT

A circuit for sharing Tx/Rx ports of a CMOS based time multiplexed transceiver includes a Low Noise Amplifier (LNA) and a Power amplifier (PA), and deploys a single RF choke shared between the LNA and PA. The circuit selectively functions as a PA cascode or a LNA input device. In one form the circuit uses MOS transistors configured for use in one of Blue tooth, WLAN and TDMA applications, taking advantage of source-drain symmetry of the MOS transistors. The circuit may include a DC path and be used in WLAN applications, wherein the sharing of the single choke is enabled by one switch in the DC path. As described, the single RF choke is disposed outside of the LNA and the PA. The circuit supports high out powers and causes reduced signal loss due to just one LC tank as opposed to two LC tanks present in the prior art.

18 Claims, 3 Drawing Sheets

OTHER PUBLICATIONS

A 2.4-GHz-band 1.8-V operation single-chip Si-CMOS T/R-MMIC front-end with a low insertion loss switch Yamamoto, K.; Heima, T.; Furukawa, A.; Ono, M.; Hashizume, Y.; Komurasaki, H.; Maeda, S.; Sato, H.; Kato, N.; Solid-State Circuits, IEEE Journal of vol. 36, Issue 8, Aug. 2001 pp. 1186-1197.

A fully integrated transformer-based front-end architecture for wireless transceivers Bhatti, I.; Roufoogaran, R.; Castaneda, J.; Solid-State Circuits Conference, 2005. Digest of Technical Papers. ISSCC. 2005 IEEE International, Feb. 6-10, 2005 pp. 106-587 vol. 1.

\* cited by examiner

TECHNIQUE FOR SHARING TRANSMIT AND RECEIVE PORTS OF A CMOS BASED TRANSCEIVER

FIELD OF THE INVENTION

This invention generally relates to schemes and techniques for sharing the transmit and receive (Tx/Rx) interface port in a transceiver, and more particularly to a technique for sharing the Rx/Tx interface port in a radio frequency (RF) interface port of a Complementary Metal Oxide Semiconductor (CMOS) based transceiver.

BACKGROUND OF THE INVENTION

Conventional schemes are known to be used for sharing the Tx/Rx interface port of a CMOS based transceiver. Typically, such conventional schemes include a power amplifier (PA) with an output and a low noise amplifier (LNA) with an input port, wherein two inductors are essentially required to share the interface port or to achieve Tx/Rx switch integration. Such a conventional scheme is exemplified by the illustration is FIG. 1 which shows a PA and a cooperating LNA. The LNA of FIG. 1 includes a resistance Rbias and a transistor T2, wherein a device which is used to implement Rbias needs to support high swings across it in the PA mode with 0V dc at its two terminals (to power down T2 and define its gate at 0V. For this purpose, low cost resistors like "NWELL" resistors or NMOS pull down device cannot be used, especially since the drain-to-substrate diode of NMOS/NWELL will turn on at high swing. Consequently, special resistors will be required to implement such conventional schemes if high PA output power is to be supported, thus driving the cost up. A typical conventional scheme of the foregoing type may be found in the publication A Single-Chip Bluetooth EDR Device in 0.13 um CMOS Marholev, B.; Pan, M.; Chien and others; Solid-State Circuits Conference, 2007, ISSCC 2007 Digest of Technical Papers, IEEE International.

A second such conventional scheme is exemplified by an arrangement shown in FIG. 2 which illustrates a second conventional circuit configuration including a LNA and a PA, wherein two inductors L1 and L2 are used. Inductor L1 is used to bias LNA and the separate inductor L2 is used to bias PA. The total power loss at the input to the circuit is the combined power loss of two LC tanks formed by L1 and its associated capacitance, and L2 and its associated capacitance. A typical conventional scheme of the second type may be found in the publication:

0.18/spl mu/m thin oxide CMOS transceiver front-end with integrated T/sub x//R/sub x/ commutator for low cost Bluetooth solutions, by Knopik, V.; Belot, D.; Solid-State Circuits Conference, 2003. ESSCIRC '03. Proceedings of the 29th European.

It is desirable to provide a technique which would mitigate the effective power loss in such conventional schemes.

SUMMARY OF THE INVENTION

The present invention in its broad form resides in a scheme and technique for sharing the transmit and receive (Tx/Rx) interface port in a transceiver, and more particularly to a technique for sharing the Rx/Tx interface port in a radio frequency (RF) interface port of a Complementary Metal Oxide Semiconductor (CMOS) based transceiver, using only a single inductor as opposed to two inductors which are required in prior art schemes. To this end, the present scheme uses controllable switches that would selectively bring in the single inductor as necessary, thereby obviating the excessive power loss which would occur with the use of two inductors. The present invention in one form, as described hereinafter, provides a circuit which accomplishes sharing the transmit-receive port of a TDMA based system by configuring the same circuit as LNA or PA (by using source-drain symmetry of MOS) preferably by using appropriate switches that are not in the signal path.

The invention in one form resides in a circuit arrangement for sharing transmit and receive ports of a CMOS based time multiplexed transceiver of the type including a Low Noise Amplifier (LNA) and a Power amplifier (PA), comprising: a single radio frequency (RF) choke or inductor which is used by sharing between said LNA and PA, the circuit arrangement using switches for selectively including the choke, the circuit arrangement being configured to have selective functioning to perform as a PA cascode or a LNA input device. Expediently, the sharing of the transmit and receive ports in the present scheme is achieved by using MOS transistors configured for use in one of Blue tooth, WLAN and TDMA applications wherein said selective functioning is achieved by taking advantage of source-drain symmetry of said MOS transistors.

In a modified form, the invention resides in a circuit arrangement for sharing transmit and receive ports of a CMOS based time multiplexed transceiver of the type including a Low Noise Amplifier (LNA) and a Power amplifier (PA), for an application chosen from Blue Tooth, TDMA and WLAN applications, comprising: a single RF choke which is used by sharing between said LNA and PA, the circuit arrangement being configured to have selective functioning to perform as a PA cascode or a LNA input device.

In the different forms of the invention recited above, the sharing of the transmit and receive ports is accomplished by deploying a single choke and the use of at least first and second switches which are judiciously located at circuit sections with the least signal content thereby facilitating minimizing power loss.

BRIEF DESCRIPTION OF THE DRAWING

A more detailed understanding of the invention may be had from the following description of embodiments, given by way of example and to be understood in conjunction with the accompanying drawing wherein.

DETAILED DESCRIPTION

A detailed description of one or more embodiments of the invention is provided below in the context of the accompanying figures that illustrate by way of example the principles of the invention. While the invention is described in connection with such embodiments, it should be understood that the invention is not limited to any embodiment. On the contrary, the scope of the invention is limited only by the appended claims, and the invention encompasses other alternatives, modifications and equivalents. For the purpose of example, certain details are set forth in the following description in order to provide a thorough understanding of the present invention. It is understood that other embodiments may be utilized and configurational changes may be made without departing from the scope of the present invention.

The present invention may be practiced according to the claims without some or all of these specific details. For the purpose of clarity, technical material that is known in the technical fields related to the invention has not been described in great detail so that the crux of the present invention is not unnecessarily obscured.

Figure 1:
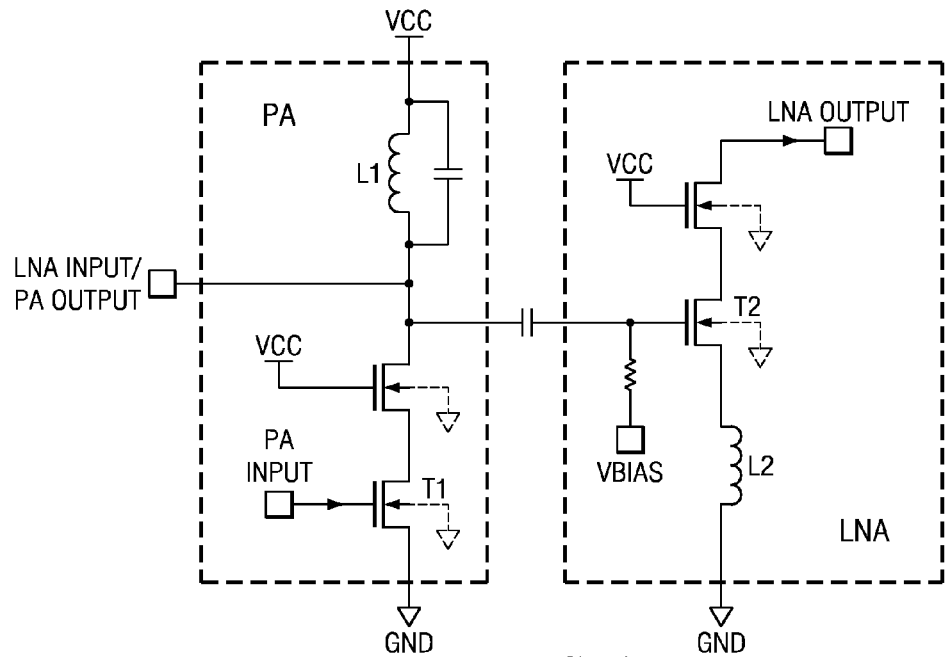
FIG. 1 shows a first conventional circuit configuration representing a prior art scheme for sharing Tx/Rx interface port using two inductors or chokes.
Figure 2:
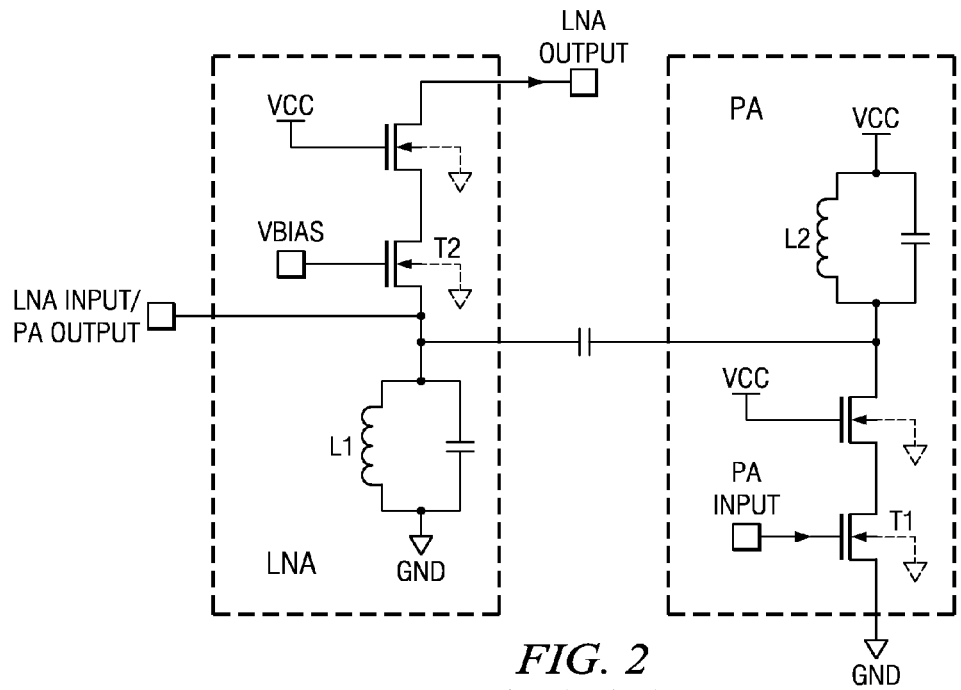
FIG. 2 shows a second conventional circuit configuration representing another prior art scheme for sharing Tx/Rx interface port using two inductors or chokes.

With specific reference to the accompanying FIGs, it is noted that FIGS. 1 and 2 represent conventional schemes used for sharing the Tx/Rx interface port in a RF transceiver wherein essentially two inductors or chokes are deployed. FIG. 1 illustrates a conventional scheme for sharing the Tx/Rx interface port in a RF transceiver, including a PA and a LNA, requiring two separate inductors/chokes L1 and L2. The LNA of FIG. 1 includes a resistance Rbias and a transistor T2, wherein a device which is used t implement Rbias needs to support high swings across it in the PA mode with 0V dc at its two terminals (to power down T2 and define its gate at 0V. For this purpose, low cost resistors like "NWELL" resistors or NMOS pull down device cannot be used, especially since the drain to substrate diode of NMOS/NWELL will turn on at high swing. Consequently, special resistors will be required to implement such conventional schemes if high PA output power is to be supported, thus driving the cost up. In one conventional scheme, an on-chip inductor L2 is used to offer 50 ohms looking into the LNA input.

FIG. 2 illustrates a second such conventional scheme for sharing the Tx/Rx interface port in a RF transceiver, and is exemplified by an arrangement including a LNA and a PA, wherein two inductors L1 and L2 are used. Inductor L1 is used to bias LNA and the separate inductor L2 is used to bias PA. The common gate configuration of LNA provides 50 ohms looking into the LNA input (Re[Yin]=gm_lna). Notably, the effective power loss at the input is the combined loss of two LC tanks formed by inductor L1 and its associated capacitance, and inductor L2 and its associated capacitance.

Figure 3:
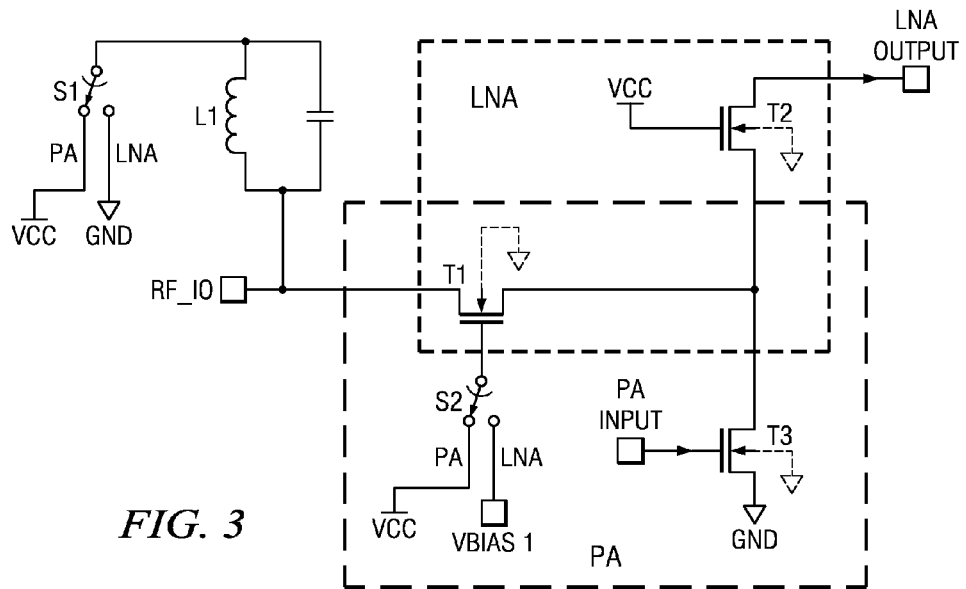
FIG. 3 illustrates one form of circuit configuration using the invention wherein a single choke is deployed in lieu of two chokes of the conventional circuit configurations.

FIG. 3 illustrates one form of the proposed scheme for sharing the Tx/Rx interface port in a RF transceiver and using but a single choke or inductor in lieu of two inductors required in the prior art schemes shown in FIGS. 1 and 2. The proposed scheme includes a LNA and a PA and is described in conjunction with FIG. 3 along with its operation. The LNA may be the first block in the receiver chain. Advantageous features of the scheme shown in FIG. 3 include the sharing of RF choke between LNA and PA using a switch in the dc path (very low or no signal loss) and using the same device as PA cascode and LNA input device by taking advantage of the source drain symmetry of MOS transistors. As shown the scheme illustrated in FIG. 3 includes switches S1 and S2 and, transistors T1, T2 and T3 connected as shown. While operating in the PA mode switch 'S1' is used to connect the DC feed (L1) to VCC (supply) and 'S2' for biasing transistor 'T1' gate to VCC. T1 acts as the PA output device (cascode) and 'T3' as the PA input device. Terminal of T1 connected to 'RF_IO' pad acts as the drain terminal of PA output device. In LNA mode switch 'S2' is used to connect the dc feed (L1) to ground and switch 'S2' to bias T1 gate at a constant voltage 'VBIAS'. T1 acts as the LNA input device in common-gate configuration and T2 as the LNA cascode device. Terminal of 'T1' connected to 'RF_IO' pad acts as the source of LNA input device in this configuration. Thus it is seen that in the configuration of the proposed scheme shown in FIG. 3 that:

1. Only one inductor is required to share the PA output and LNA input port (or Tx/Rx switch integration) in this scheme as opposed to configurations shown in FIG. 1 or FIG. 2 as well as reference 2 listed hereinafter.
2. Switches are placed at the sections with the least signal content to minimize signal loss unlike normal Tx/Rx switches in the signal path.
3. The present scheme is able to support output powers as high as the process allows for a single NMOS transistor without requirement for any special resistors or PMOS as in known prior art schemes for supporting high output powers.
4. As an example, common gate configuration of LNA provides 50 Ohms looking in impedance (Re[Yin]= gm_lna).
5. The same device can be used as LNA input transistor and Power amplifier output transistor reducing the extra routing and associated loss.
6. The signal loss is limited to what is caused by just one LC tank compared to two LC tanks in prior art scenarios.
7. The scheme is capable of being implemented in the 65 nm Bluetooth transceiver of Texas Instruments, which is a modified version of the illustration in FIG. 4.

Figure 4:
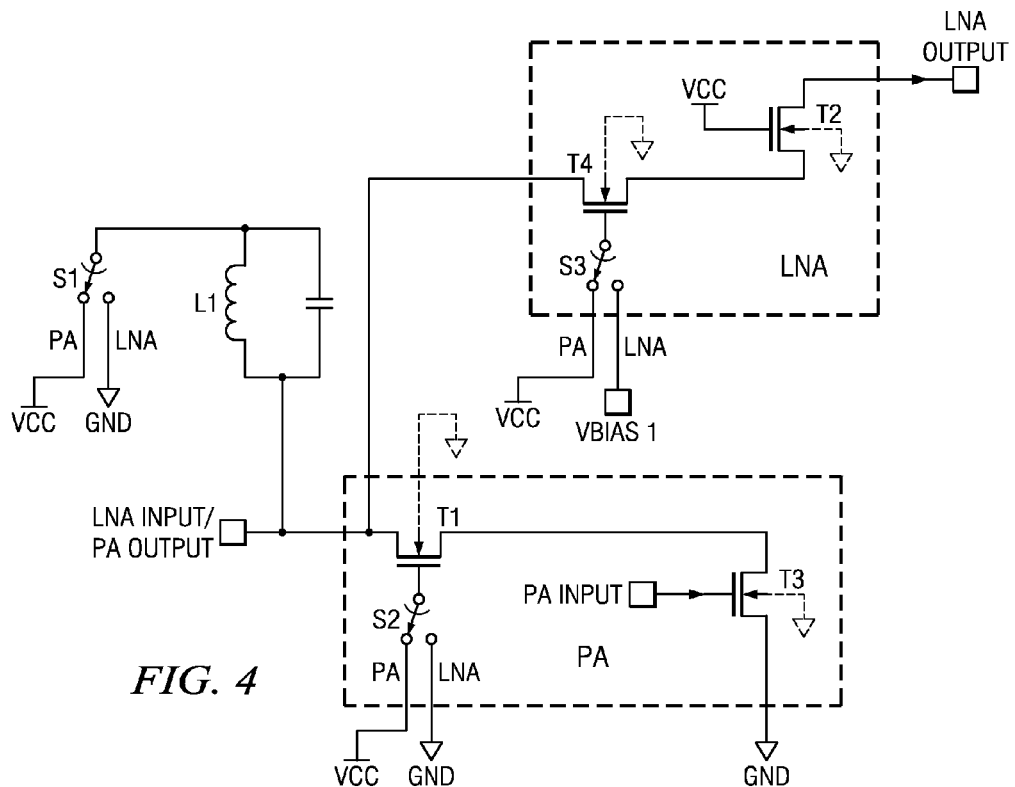
FIG. 4 illustrates a modified form of circuit configuration using the concept of the invention wherein a single choke is deployed in lieu of two chokes of the conventional circuit configurations; and, FIG. 5 illustrates a further modification of the inventive circuit configuration showing a generic scheme that shares both the input and output devices.
Figure 5:
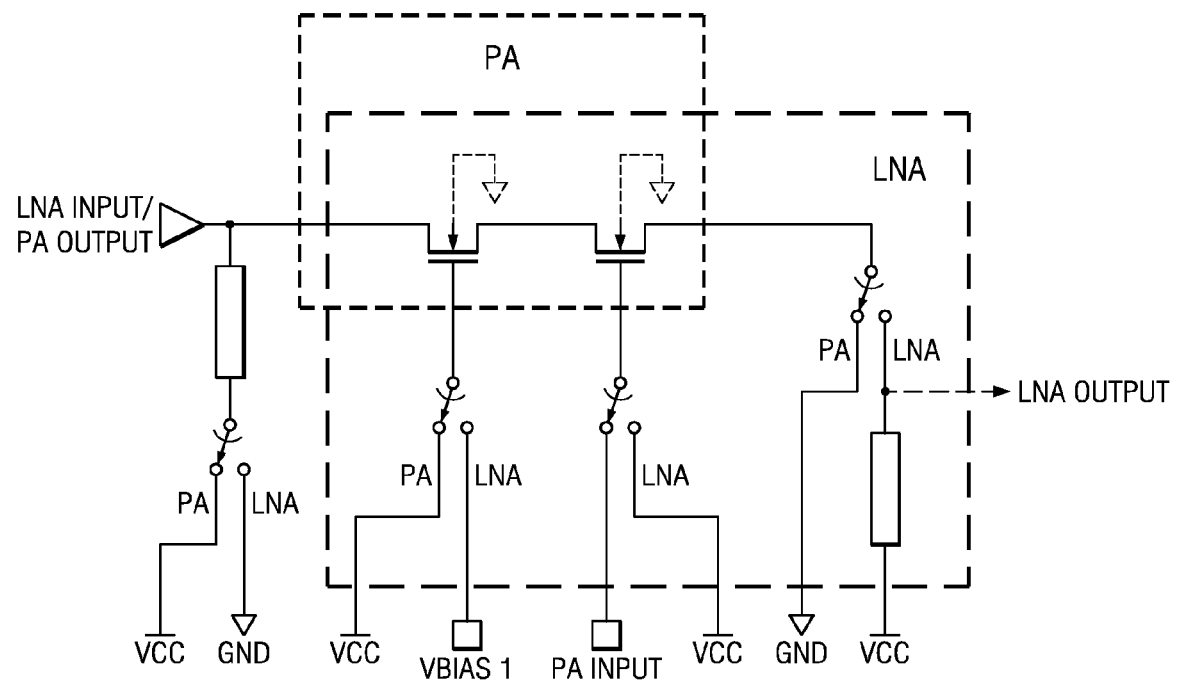

A modified scheme that separates the input transistor of LNA & output device of PA if the transistor sizing needs to be different is shown in FIG. 4, and further modification to arrive at a generic scheme that shares both the input and output device is shown in FIG. 5.

With specific reference to the schematic of FIG. 4, it is noted that a single inductor L1 is used as opposed to two inductors in the conventional prior art schematics. Expediently, the single inductor L1 is situated outside of the LNA and PA blocks. Further, the FIG. 4 scheme utilizes switches S1, S2 and S3 as illustrated. The LNA block includes transistors T2 and T4 whereas the PA block includes transistors T1 and T3 as illustrated. Switch S1 will be connected to GND in the LNA mode when T4 will act as the LNA input stage. Switch S1 will be connected to VCC in the power amplifier mode when T1 acts as a PA cascode device. Further, switch S3 will be connected to V BIAS 1 in the LNA mode when T4 will act as the LNA input stage. Switch S2 will be connected to VCC in the power amplifier mode when T1 will act as the PA cascode device. It is noted that as shown, FIG. 4 illustrates an expansion of FIG. 3 with device T1 (of FIG. 3) split into T1 (for PA application) and T4 (for LNA application).

FIG. 5 illustrates a modification of FIG. 3 with devices T2 & T3 (of FIG. 3) combined to form one device with appropriate switches to enable configuration in either LNA mode or PA mode.

As described hereinabove, the present approach accomplishes sharing the transmit-receive port of any TDMA based system by configuring the same circuit as LNA or PA (by using source-drain symmetry of MOS) preferably by using appropriate switches that are not in the signal path. It is noted that different implementations of the proposed main scheme with a single inductor are shown in the FIGS. 3 to 5.

The following features are noted in the context of the present invention: (a) Source drain symmetry of MOS device is used to implement a loss-less Tx/Rx switch in the proposed scheme. (b) Switches or loss elements like transformers are not used in the signal path unlike as in prior art solutions. (c)

The number of inductors (and RF chokes) in the proposed scheme is less than the number in any existing conventional solution.

Some advantages resulting from the proposed scheme include the following:

The number of inductors (and RF chokes) is less than the number in any existing solution (one inductor as against two in conventional schemes).

No switches or elements inducing excess loss are used in the signal path (unlike the case in the conventional schemes).

Herein, for comparison purposes, prior art arrangements listed herein as references 1, 2, 3 and 4 at the end of the text are considered. Compared to 2.5 dB insertion loss for the solution shown in reference-4 (this has details of the front-end section of reference-1) and 1.5 dB of reference-3, the proposed solution has a loss of only 0.42 dB given by the quality factor of tank circuit formed by inductor "L1" and the capacitor across it. Using the present approach, the same inventive device can be selectively used as a power amplifier output device and low noise amplifier input device resulting in minimal associated power loss and minimal signal routing compared to other solutions. The solution proposed herein is used in a single chip Bluetooth transceiver that achieves −92 dBm sensitivity (Rx) and 13 dBm output power (Tx) in the 65 nm process of Texas Instruments, which excels the performance of any known single chip Bluetooth solution known in the art.

In the foregoing detailed description of embodiments of the invention, various features are grouped together in a single exemplary embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should therefore be determined with reference to the appended claims, along with the full scope of equivalents to which such claims are entitled. In the appended claims, the terms "including" and "in which" where present, are used as the plain-English equivalents of the respective terms "comprising" and "wherein," respectively. Moreover, the terms "first," "second," and "third," etc., where used are merely as labels, and are not intended to impose numerical requirements or limitations on the related objects.

The invention claimed is:

1. A circuit arrangement for sharing transmit and receive ports of a CMOS based time multiplexed transceiver of the type including a low noise amplifier (LNA) and a power amplifier (PA), comprising:
   a single radio frequency (RF) choke which is used by sharing between said LNA and PA,
   said circuit arrangement being configured to have selective functioning to perform as a PA cascode or a LNA input device,
   said circuit arrangement using MOS transistors configured for use in one of Blue tooth, WLAN and TDMA applications wherein said selective functioning is achieved by taking advantage of source-drain symmetry of said MOS transistors.

2. The circuit arrangement of claim 1 for use in WLAN applications including a DC path, wherein said sharing of the single choke is done by using at least one switch in said DC path.

3. The circuit arrangement of claim 1 for use in TDMA applications including a DC path, wherein said sharing of the single choke is done by using at least one switch in said DC path.

4. The circuit arrangement of claim 1 wherein said single RF choke is disposed outside of said LNA and outside of said PA.

5. The circuit arrangement of claim 1 including circuit-sections and switches, wherein said switches are placed at those sections which have a least signal content to minimize signal loss content.

6. The circuit arrangement of claim 1 configured for use selectively as a LNA input transistor or a PA output transistor.

7. The circuit arrangement of claim 1 configured for use in a 65 nm Blue Tooth transceiver.

8. The circuit arrangement of claim 1 wherein said sharing is assisted by a first switch (S1) which is connected to ground in LNA mode.

9. A circuit arrangement in TDMA applications for integration of transmit and receive ports of a CMOS based time multiplexed transceiver of the type including a low noise amplifier (LNA) and a power amplifier (PA), comprising:
   a single RF choke which is used by sharing between said LNA and PA,
   said circuit arrangement being configured to have selective functioning to perform as a PA cascode or a LNA input device,
   said circuit arrangement using MOS transistors wherein said selective functioning is achieved by taking advantage of source-drain symmetry of said MOS transistors.

10. A circuit arrangement for sharing transmit and receive ports of a CMOS based time multiplexed transceiver of the type including a low noise amplifier (LNA) and a power amplifier (PA), for an application chosen from Blue Tooth, TDMA and WLAN applications, comprising:
    a single RF choke which is used by sharing between said LNA and PA,
    said circuit arrangement being configured to have selective functioning to perform as a PA cascode or a LNA input device,
    said circuit arrangement using MOS transistors wherein said selective functioning is achieved by taking advantage of source-drain symmetry of said MOS transistors.

11. The circuit arrangement of claim 10 for use in WLAN applications including a DC path, wherein said sharing of the single choke is done by using at least one switch in said DC path.

12. The circuit arrangement of claim 10 for use in TDMA applications including a DC path, wherein said sharing of the single choke is done by using at least one switch in said DC path.

13. The circuit arrangement of claim 10 wherein said single RF choke is disposed outside of said LNA.

14. The circuit arrangement of claim 10 including circuit-sections and switches, wherein said switches are placed at those sections which have a least signal content to minimize signal loss content.

15. The circuit arrangement of claim 10 configured for use selectively as a LNA input transistor or a PA output transistor.

16. The circuit arrangement of claim 10 configured for use in a 65 nm Blue Tooth transceiver.

17. The circuit arrangement of claim 10 wherein said sharing is assisted by a first switch (S1) which is connected to ground in LNA mode.

18. A circuit arrangement in TDMA applications for integration of transmit and receive ports of a CMOS based time multiplexed transceiver of the type including a low noise amplifier (LNA) and a power amplifier (PA), comprising:

a single RF choke which is used by sharing between said LNA and PA, said circuit arrangement being configured to have selective functioning to perform as a PA cascode or a LNA input device, said circuit arrangement using MOS transistors wherein said selective functioning is achieved by taking advantage of source-drain symmetry of said MOS transistors.

* * * * *